US010268846B2

(12) United States Patent
Miller et al.

(10) Patent No.: US 10,268,846 B2
(45) Date of Patent: Apr. 23, 2019

(54) HIGH VOLTAGE INDUCTIVE ADDER

(71) Applicant: Eagle Harbor Technologies, Inc., Seattle, WA (US)

(72) Inventors: Kenneth E. Miller, Seattle, WA (US); James R. Prager, Seattle, WA (US); Timothy M. Ziemba, Bainbridge Island, WA (US); John G. Carscadden, Seattle, WA (US); Christopher Matthew Bowman, Seattle, WA (US); Ilia Slobodov, Seattle, WA (US)

(73) Assignee: EAGLE HARBOR TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 15/859,163

(22) Filed: Dec. 29, 2017

(65) Prior Publication Data
US 2018/0189524 A1 Jul. 5, 2018

Related U.S. Application Data

(60) Provisional application No. 62/440,919, filed on Dec. 30, 2016.

(51) Int. Cl.
G01R 21/00 (2006.01)
G06F 9/00 (2006.01)
H04L 29/08 (2006.01)
H04W 52/02 (2009.01)
G06G 7/14 (2006.01)
G06G 7/02 (2006.01)

(52) U.S. Cl.
CPC .............. G06G 7/14 (2013.01); G06G 7/02 (2013.01)

(58) Field of Classification Search
CPC ... G06G 7/14; G06G 7/02; H03K 3/57; H01F 27/28; H01F 27/02
USPC .................................................. 336/92–234
See application file for complete search history.

(56) References Cited

U.S. PATENT DOCUMENTS

| 4,055,803 A | 10/1977 | Kraley et al. |
| 5,179,365 A | 1/1993 | Raggi |
| 5,905,646 A * | 5/1999 | Crewson .................. H03K 3/57 363/132 |

(Continued)

FOREIGN PATENT DOCUMENTS

| WO | 2014/111328 A1 | 7/2014 |
| WO | 2016/051210 A1 | 4/2016 |

Primary Examiner — Brandon S Cole

(57) ABSTRACT

A high voltage inductive adder is disclosed. In some embodiments, the high voltage inductive adder comprising a first adder circuit and a second adder circuit. The first adder circuit including a first source; a first switch electrically coupled with the first source; a first transformer core; and a first plurality of primary windings wound about the first transformer core and electrically coupled with the first switch. The second adder circuit including a second source; a second switch electrically coupled with the second source; a second transformer core; and a second plurality of primary windings wound about the second transformer core and electrically coupled with the second switch. The high voltage inductive adder comprising one or more secondary windings wound around both the first transformer core and the second transformer core and an output coupled with the plurality of secondary windings.

8 Claims, 13 Drawing Sheets

(56) References Cited

U.S. PATENT DOCUMENTS

| | | | |
|---|---|---|---|
| 6,741,484 B2 | 5/2004 | Crewson et al. | |
| 2001/0030527 A1* | 10/2001 | Iida | H03K 3/57 |
| | | | 323/251 |
| 2006/0125593 A1* | 6/2006 | Piaskowski | H01F 27/085 |
| | | | 336/229 |
| 2009/0316438 A1* | 12/2009 | Crewson | H03K 17/127 |
| | | | 363/16 |
| 2012/0206229 A1* | 8/2012 | Casper | H01F 30/16 |
| | | | 336/90 |
| 2015/0200051 A1* | 7/2015 | Umetani | H01F 3/12 |
| | | | 336/178 |
| 2015/0228401 A1* | 8/2015 | Ratz | H01F 27/324 |
| | | | 336/92 |
| 2015/0318846 A1* | 11/2015 | Prager | H03K 17/005 |
| | | | 327/304 |
| 2016/0226470 A1* | 8/2016 | Hartmann | H03K 3/02 |
| 2016/0238412 A1* | 8/2016 | Germann | G01D 5/204 |
| 2017/0154726 A1* | 6/2017 | Prager | H01F 27/24 |

* cited by examiner

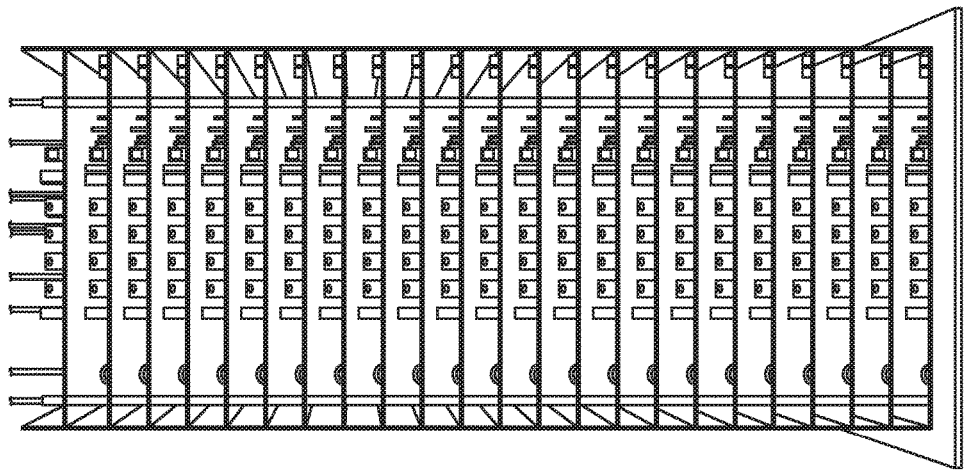
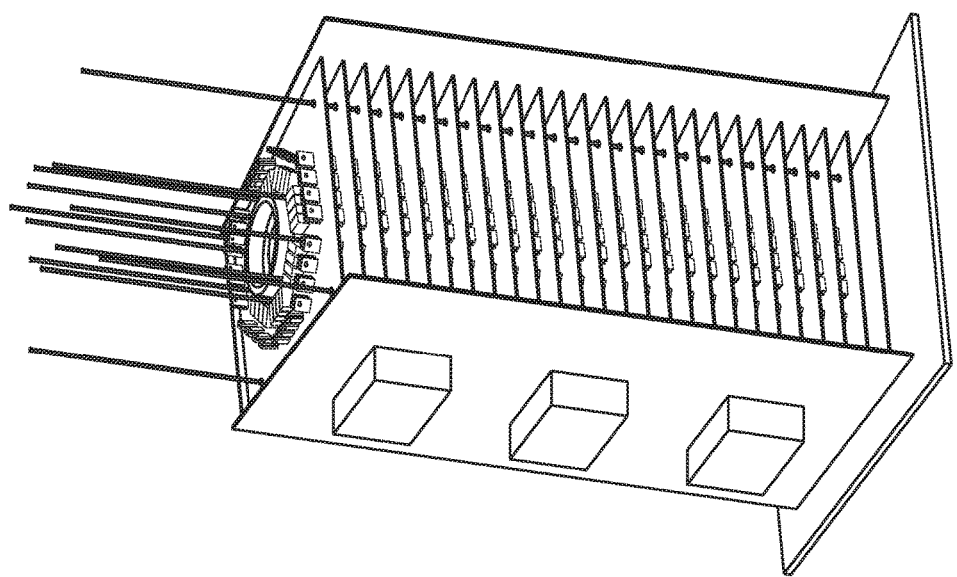
FIG. 10

US 10,268,846 B2

HIGH VOLTAGE INDUCTIVE ADDER

BACKGROUND

Producing high voltage pulses with fast rise times is challenging. For instance, to achieve a fast rise time (e.g., less than about 50 ns) for a high voltage pulse (e.g., greater than about 10 kV), the slope of the pulse rise must be incredibly steep. Such a steep rise time is very difficult to produce. This is especially difficult using standard electrical components in a compact manner. It is additionally difficult to produce such a high voltage pulse with fast rise times having variable pulse widths and/or a variable high pulse repetition rate.

SUMMARY

A high voltage inductive adder is disclosed. In some embodiments, the high voltage inductive adder comprising a first adder circuit and a second adder circuit. The first adder circuit including a first source; a first switch electrically coupled with the first source; a first transformer core; and a first plurality of primary windings wound about the first transformer core and electrically coupled with the first switch. The second adder circuit including a second source; a second switch electrically coupled with the second source; a second transformer core; and a second plurality of primary windings wound about the second transformer core and electrically coupled with the second switch. The high voltage inductive adder comprising one or more secondary windings wound around both the first transformer core and the second transformer core and an output coupled with the plurality of secondary windings.

A high voltage inductive adder is disclosed. In some embodiments, the high voltage inductive adder comprising a plurality of voltage sources; a plurality of switches, each switch of the plurality of switches electrically coupled with a respective one of the plurality of voltage sources; a plurality of transformer cores; a plurality of primary windings, each primary winding of the plurality of primary windings are wound around a respective one of the plurality of transformer cores and each primary winding of the plurality of primary windings are electrically coupled with a respective one of the plurality of switches; and a secondary winding wound around the plurality of transformer cores.

In some embodiments, the high frequency inductive adder has a volume less than about 0.2 m³, 1.0 m³, 2.0 m³, 5.0 m³, etc. and/or a mass less than about 1200 kg, 1000 kg, 750 kg, 500 kg, 250 kg, 150 kg, 125 kg, 100 kg, 50 kg, etc.

In some embodiments, the high frequency inductive adder produces an output signal at the output having a voltage greater than about 50 kV. In some embodiments, the output voltage can be as high as 20 kV, 100 kV, 250 kV, 500 kV, 1 MV, etc.

In some embodiments, the output signal has a rise time of less than about 200 ns, 100 ns, 33 ns, 20 ns, 3 ns, etc.

In some embodiments, the output signal has a variable or varying pulse repetition frequency and/or a variable or varying voltage and/or variable or varying pulse width.

In some embodiments, the high voltage inductive adder drives a load with an impedance less than about 1000 ohms, 200 ohms, 100 ohms, 20 ohms, 2 ohms, etc.

In some embodiments, the first plurality of primary windings and the second plurality of primary windings each comprise a conductive sheet.

A high voltage inductive adder is disclosed. The high voltage inductive adder comprising a first adder circuit and a second adder circuit. The first adder circuit including a first source; and a first switch electrically coupled with the first source; a first transformer core having a torus shape with a first central aperture, the first transformer core electrically coupled with the first switch. The second adder circuit including a second source; a second switch electrically coupled with the second source; and a second transformer core having a torus shape with a second central aperture, the second transformer core electrically coupled with the second switch. The high voltage inductive adder comprising a secondary winding including: an inner rod disposed within the first central aperture and the second central aperture; and outer cylinder surrounding the first transformer core and the second transformer core. The high voltage inductive adder comprising an output coupled with the outer cylinder and the inner rod. The inner rod and the outer cylinder may be electrically coupled to form a secondary winding of the transformer circuit.

In some embodiments, the outer cylinder comprises a first cylinder surrounding the first transformer core and a second cylinder surrounding the second ring, the first cylinder and the second cylinder being electrically connected.

In some embodiments, the inner rod comprises a metal such as, for example, aluminum and/or the outer cylinder comprises a metal such as, for example, brass.

In some embodiments, the high frequency inductive adder produces an output signal at the output having a voltage greater than about 20 kV, 50 kV, 100 kV, 250 kV, 500 kV, 1 MV, etc.

In some embodiments, the output signal has a rise time of less than about 200 ns, 100 ns, 33 ns, 20 ns, 3 ns, etc.

In some embodiments, the output signal has a variable or varying pulse repetition frequency and/or a variable or varying voltage and/or variable or varying pulse width.

In some embodiments, the high frequency inductive adder has a volume less than about 0.2 m³, 1.0 m³, 2.0 m³, 5.0 m³, etc. and/or a mass less than about 1200 kg, 1000 kg, 750 kg, 500 kg, 250 kg, 150 kg, 125 kg, 100 kg, 50 kg, etc.

In some embodiments, the high voltage inductive adder drives a load with an impedance less than about 1000 ohms, 200 ohms, 100 ohms, 20 ohms, 2 ohms, etc. These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

FIG. 10 includes two images of an inductive adder according to some embodiments.

DETAILED DESCRIPTION

Figure 1:
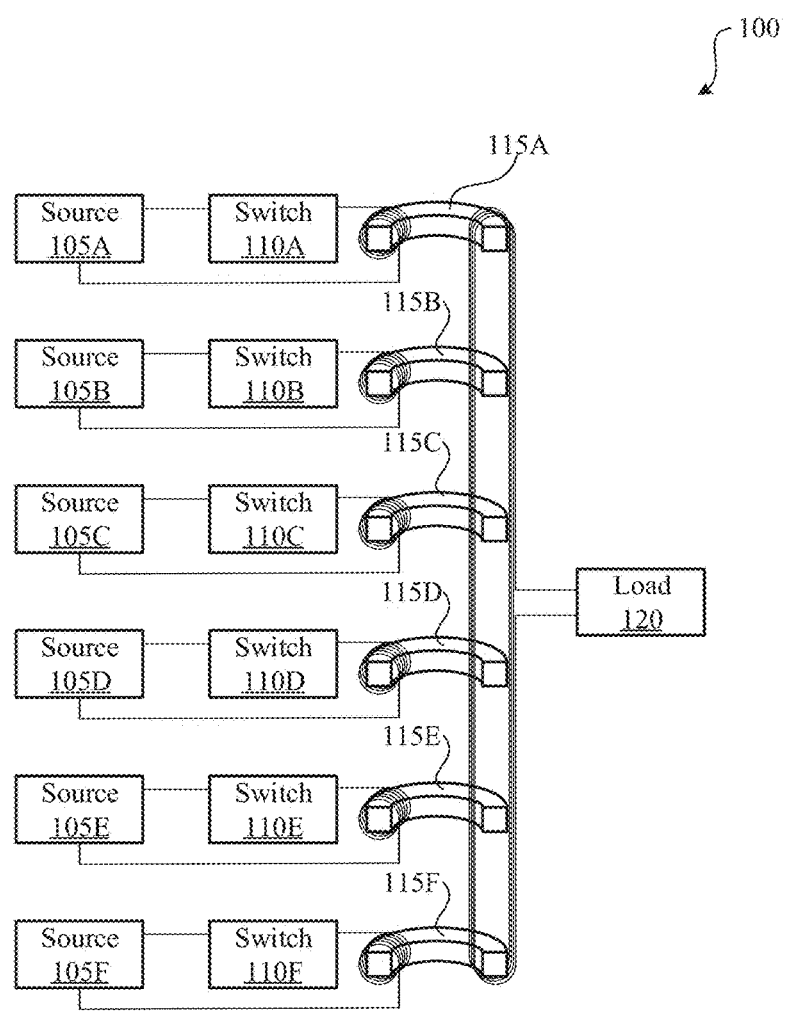
FIG. 1 illustrates a block diagram of an example inductive adder according to some embodiments of the invention.

Some embodiments are directed toward a high voltage inductive adder that may include a plurality of source and switch circuits coupled with a plurality of transformers via a plurality of primary windings wound around a plurality of transformer cores. A single secondary winding (or a plurality of secondary windings) may be wound around each of the plurality of transformer cores. In some embodiments, the volume of the inductive adder is less than about $0.2 \text{ m}^3$, $1.0 \text{ m}^3$, $2.0 \text{ m}^3$, $5.0 \text{ m}^3$, etc. and/or a mass less than about 1200 kg, 1000 kg, 750 kg, 500 kg, 250 kg, 150 kg, 125 kg, 100 kg, 50 kg, etc. In some embodiments, the output signal of the inductive adder may have a flattop voltage greater than about 5 kV, 8 kV, 20 kV, 50 kV, 100 kV, 250 kV, 500 kV, 1 MV.

In some embodiments, an inductive adder may be a modular system with a plurality of stacked switching circuit boards. In some embodiments, an inductive adder may drive 1000 ohms, 200 ohms, 100 ohms, 20 ohms, 2 ohms, etc. loads to voltages greater than about 5 kV, 8 kV, 20 kV, 50 kV, 100 kV, 250 kV, 500 kV, 1 MV or more with rise times of less than about 200 ns, 100 ns, 33 ns, 20 ns, 3 ns, etc. In some embodiments, an inductive adder may produce variable pulse widths of up to 100 ns. In some embodiments, an inductive adder may operate at frequencies greater than about 2 kHz, 10 kHz, 25 kHz, 300 kHz, 6 MHz, etc. In some embodiments, an inductive adder may provide an output pulse with pulse widths of about 1 ns, 22 ns, 400 ns, 1000 ns, etc.

In some embodiments, an inductive adder may include a plurality of stack of PCBs, each of which may be charged in parallel. In some embodiments, the center of the stack may include a single turn coaxial transformer, arranged such that the secondary output voltage of each PCB stack adds in series, meaning that the overall output voltage is proportional to the number of PCBs in the stack. In some embodiments, the coaxial transfer may include a rod that goes through the center of the transformer. The rod, for example may be at high voltage, while a set of copper rings outside the diameter of the transformer core may complete the current path and/or create a sealed cavity which can be filled with oil. In some embodiments, the top (output) of the stack may connect directly to a 50Ω coaxial cable, which may connect with the load. In some embodiments, the output may connect to a coaxial transmission line and/or a planar transmission line, for example, with impedances between about 0.1 ohms and 100 ohms.

In some embodiments, each PCB in the stack may contribute a voltage of 1.6 kV. Therefore, an inductive adder that includes 16 PCBs may produce an output signal of 25 kV; and two inductive adders stacked together may produce an output signal of 20 kV. Two inductive adders may be stacked in either series or parallel. Alternatively, each PCB in the stack may provide voltages from about 100 V to 12 kV. Any number of these PCBs may be stacked to create an inductive adder with higher voltages.

Each PCB and/or circuit in the stack may be designed and/or constructed to reduce stray inductance. For example, the PCB thickness may be reduced. As another example, the transformer core may include an upper portion placed above the circuit board and a lower portion placed below the circuit board. Each circuit on a PCB may, for example, include 4, 8, 16, 32, 64, 96, or more switches. These switches may include any type of semiconductor switch such as, for example, a Si, SiC, GaN, etc. switch. In some embodiments, each PCB may have an inductance of less than about 300 nH, 30 nH, 3 nH, 0.3 nH, etc. as measured from the primary side of the circuit.

Each PCB and/or circuit in the stack may be designed and/or constructed to reduce stray capacitance. For example, a coaxial transformer may be used to reduce stray capacitance. As another example, the secondary windings may be grouped into four or eight clusters distributed radially around the transformer core. The stray capacitance, for example, of the transformer may be less than about 600 pF, 300 pF, 100 pF, 70 pf, 50 pf, 30 pF, 10 pF, 5 pF, 1 pf, etc. The stray capacitance may be the equivalent parasitic capacitance that would appear in parallel with the load, for example, as measured/viewed from the secondary side of the circuit.

In some embodiments, a high frequency inductive adder may include: a first source; a first switch electrically coupled with the first source; a first transformer core; a first plurality of primary windings wound about the first transformer core and electrically coupled with the first switch; a second source; a second switch electrically coupled with the second source; a second transformer core; a second plurality of primary windings wound about the second transformer core and electrically coupled with the second switch; one or more secondary windings wound around both the first transformer core and the second transformer core; and an output coupled with the second plurality of windings. In some embodiments, the high voltage inductive adder has a volume less than about $0.2 \text{ m}^3$, $1.0 \text{ m}^3$, $2.0 \text{ m}^3$, $5.0 \text{ m}^3$, etc.; and/or has a mass less than about 1200 kg, 1000 kg, 750 kg, 500 kg, 250 kg, 150 kg, 125 kg, 100 kg, 50 kg, etc., and/or produces an output signal at the output having a voltage greater than about 5 kV, 8 kV, 20 kV, 50 kV, 100 kV, 250 kV, 500 kV, 1 MV, etc. In some embodiments, the output signal of the inductive adder may have a rise time of less than about 20 ns. In some embodiments, the output signal of the inductive adder may have a variable or varying pulse repetition frequency. In some embodiments, the output signal of the inductive adder may have a rise time of less than about 200 ns, 100 ns, 33 ns, 20 ns, 3 ns, etc. In some embodiments, an inductive adder may provide an output pulse with pulse widths of about 1 ns, 22 ns, 400 ns, 1000 ns, etc. In some embodiments, the output signal of the inductive adder may have a variable or varying pulse width. In some embodiments, the output signal of the inductive adder may have a variable or varying output voltage.

In some embodiments, an inductive adder may drive a load of various impedance. For example, the inductive adder may drive a 50 ohm load. As another example, the inductive adder may drive a 100 ohm load. As another example, the inductive adder may drive a 1000 ohm load. As another example, the inductive adder may drive a 10,000 ohm load. As another example, the inductive adder may drive a 20,000 ohm load. As another example, the inductive adder may drive a load of about 1000 ohms, 200 ohms, 100 ohms, 20 ohms, 2 ohms, etc.

FIG. 1 illustrates a block diagram of an example inductive adder 100 according to some embodiments of the invention. An inductive adder 100 may include a plurality of stages that each include a source 105 and/or switch circuit 110 coupled with one or more transformers 115 via a primary winding. In some embodiments, the primary winding may include a plurality of single turn primary windings. A secondary winding may be wound around all (or at least more than one) of the plurality of transformers 115 of the plurality of circuits. The secondary winding may be coupled with a load 120. Any number of circuits may be used. The output voltage and/or the output current, for example, may depend on the ratio of primary windings to secondary windings. The output voltage and/or the output current, for example, may depend on the number of stages (e.g., each stage may include at least a source 105, a switch circuit 110 and/or a primary winding).

In some embodiments, the drivers circuit 105 may include a single power supply or a plurality of power supplies. In some embodiments, the source 105 may include or effectively act as a capacitor. Any type of power supply may be used.

In some embodiments, each switch circuit 110 may include any solid state switching device that can switch high voltages such as, for example, a solid-state switch, an IGBT, an FET, a MOSFET, a SiC junction transistor, a GaN switch, or a similar device. Each switch circuit 110 may, for example, include a collector and an emitter (or, for example, a source and a drain). Various other components may be included with each switch circuit 110 in conjunction with each switch 110. Each individual switch may include a plurality of switches in parallel, in series, or some combination thereof may be coupled with the transformer 115.

In some embodiments, the combination of the source 105 and/or the switch circuit 110 may include a fast capacitor and/or an inductor.

When a switch circuit 110 is closed, energy from the associated source 105 may be discharged into the primary winding of the associated transformer 115.

In some embodiments, the load 120 may include an ultraviolet light source. In some embodiments, the load 120 may include a high-power microwave source, a nonlinear transmission line, a strip line kicker, a semiconductor etch system, a medical device, a dielectric barrier discharge device, a low temperature plasma generation device, a low temperature plasma arc device, an aqueous-electrolyte resistor, a capacitor, a cable, etc., or some combination thereof.

Moreover, in some embodiments, the energy within the source 105 may not be substantially drained during each switch cycle, which may allow for a higher pulse repetition frequency. For example, in one switch cycle 5%-50% of the energy stored within the source 105 may be drained. As another example, in one switch cycle 10%-40% of the energy stored within the source 105 may be drained. As yet another example, in one switch cycle 15%-25% of the energy stored within the source 105 may be drained. As yet another example, in one switch cycle 0.1%-10% of the energy stored within the source 105 may be drained.

Each switch circuit 110 and the source 105 may be coupled with a transformer 115. The transformer 115, for example, may include capacitors, inductors, resistors, other devices, or some combination thereof. The transformer 115 may include a toroid shaped transformer core with a plurality of primary windings and one or more secondary windings wound around the transformer core. In some embodiments, there may be more primary windings than secondary windings. In some embodiments, there may be less primary windings than secondary windings.

In some embodiments, the transformer 115 may include a toroid shaped transformer core comprised of air, iron, ferrite, soft ferrite, MnZn, NiZn, hard ferrite, powder, nickel-iron alloys, amorphous metal, glassy metal, or some combination thereof.

In some embodiments, the transformer primary to secondary stray capacitance and/or the transformer secondary stray capacitance may be below about 10 pF, below about 100 pF, below about 1,000 pF, about 33 pF, etc., as viewed/measured on/from the primary side. In some embodiments, the sum of the secondary stray capacitance and the primary stray capacitance may be less than about 1 pF, 10 pF, 20 pF, 200 pF, 1200 pF, 66 pF, etc., as viewed/measured on/from the secondary side of the circuit.

In some embodiments, the secondary stray inductance of the transformer and/or the primary stray inductance of the transformer, both as viewed/measured from the primary side, may have an inductance value, for example, of 1 nH, 2 nH, 5 nH, 10 nH, 20 nH, between about 1 nH and 1,000 nH, less than about 0.1 nH, less than about 12 nH, etc.

In some embodiments, an inductive adder may be designed with low stray capacitance. For example, the sum of all stray capacitance within the inductive adder and/or source circuit and/or switch circuit and/or transformer circuit may be below 500 pF. This may include, for example, transformer circuit stray capacitance, switch circuit stray capacitance, other stray capacitance, or some combination thereof. The stray capacitance may be the equivalent parasitic capacitance that would appear in parallel with the load, for example, as measured/viewed from the secondary side of the circuit.

The primary windings of the transformer 115 can include a plurality of single windings. For example, each of the primary windings may include a single wire that wraps around at least a substantial portion of the toroid shaped transformer core and terminate on either side of the transformer core. As another example, one end of the primary windings may terminate at the collector of the switch circuit 110 and another end of the primary windings may terminate at the source 105. Any number of primary windings in series or in parallel may be used depending on the application. For example, about 1, 5, 10, 20, 40, 50, 100, 116, 200, 250, 300, etc. or more windings may be used for the primary winding.

Figure 3:
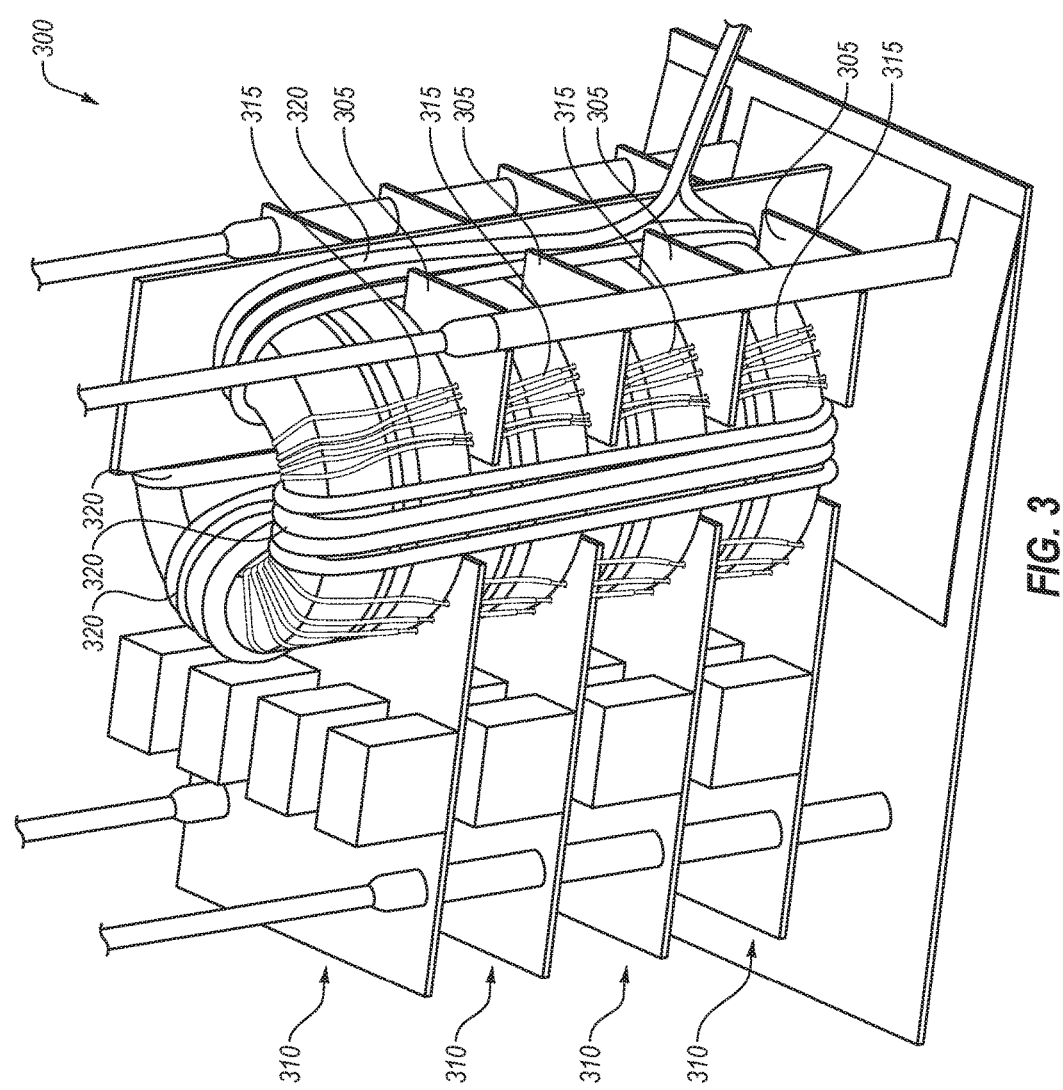
FIG. 3 is a photograph of a stacked inductive adder according to some embodiments.

The secondary winding may include a single wire wrapped around each of the transformers any number of times. For example, the secondary winding may include 5, 10, 20, 30, 40, 50, 100, etc. windings. As another example, the secondary winding may include tubes, sheets, and/or metal rings. In some embodiments, the secondary winding may wrap around the transformer core and through portions of the circuit board (e.g., as shown in FIG. 3 and/or FIG. 4). For example, the transformer core may be positioned on the circuit board with a plurality of slots in the circuit board arranged axially around the outside of the transformer core and an interior slot in the circuit board positioned in the center of the toroid shaped transformer core. The secondary winding may wrap around the toroid shaped transformer core and wrap through slots and the interior slot. The secondary winding may include high voltage wire.

In some embodiments, the output signal at the load 120 can have a pulse frequency that is proportional to a pulse frequency provided by each of the plurality of sources 105 either singularly or in combination. In some embodiments, the output signal at the load 120 can have a pulse width that is proportional to a pulse width provided by each of the plurality of sources 105 either singularly or in combination.

Figure 2:
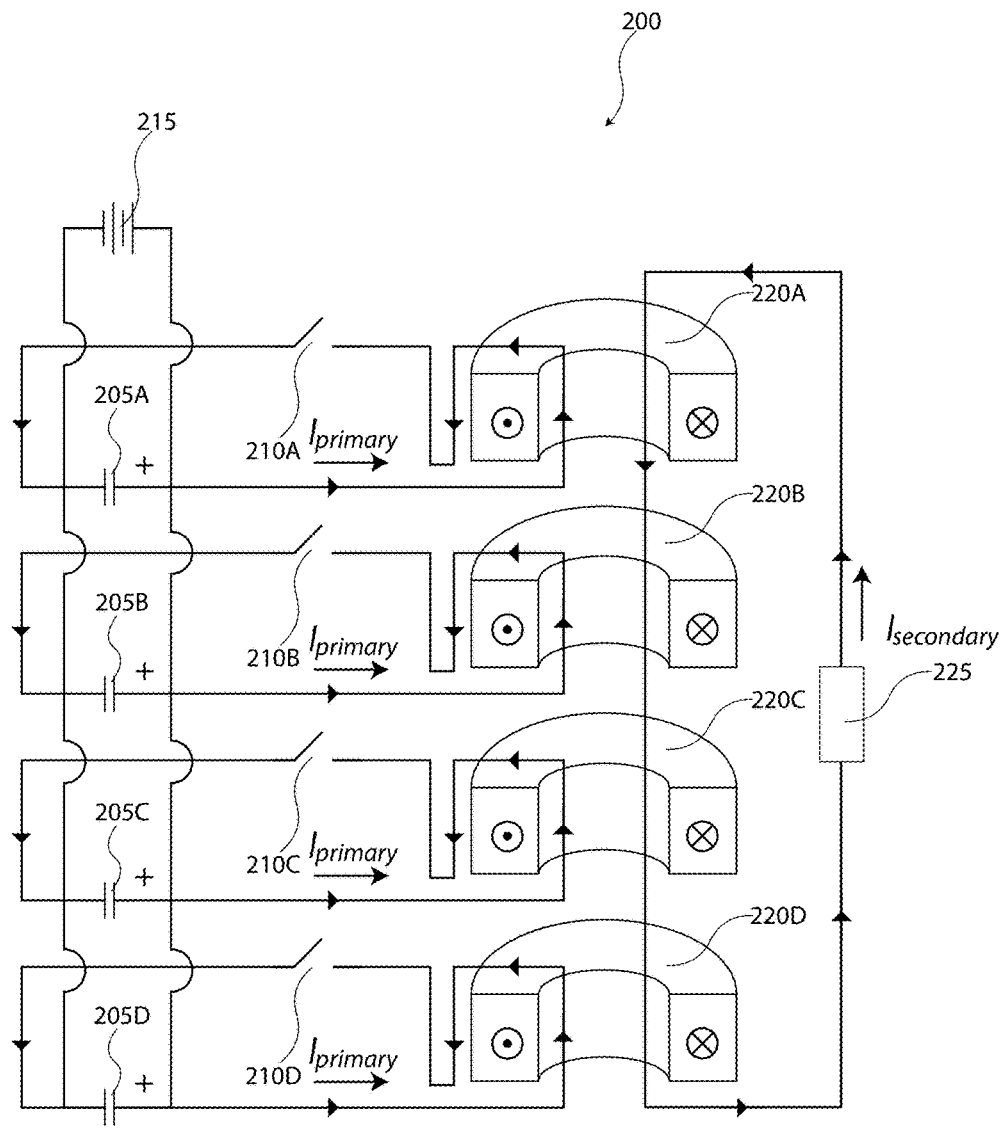
FIG. 2 illustrates a block diagram of another example inductive adder according to some embodiments of the invention.

FIG. 2 illustrates a block diagram of another example inductive adder 200 according to some embodiments. The inductive adder 200 may include a plurality of voltage sources 205 and/or a plurality of switches 210. The individual voltage sources may be fed by a single voltage source 215. When each switch 210 is closed primary current, $I_{primary}$, flows from the plurality of voltage sources 215 through a respective winding wound about a respective transformer 220 of a plurality of transformers. A secondary winding may be wound about one or more of the plurality of transformers and is coupled to a load 225. The secondary current, $I_{secondary}$ may flow from the secondary winding through the load 225.

FIG. 3 is a photograph of a stacked inductive adder 300 according to some embodiments. In this example, four driver and switch circuits 310 with four transformers 315 are stacked one on top of another. In this example, the various components of each driver and switch are placed on a single circuit board 305 along with a single transformer 315. The driver and switch are coupled with the transformer via a plurality of windings distributed around the transformer. The secondary winding 320 wraps around the four transformers 315. The inductive adder 300, for example, may encompass a small volume inductive adder.

Figure 4:
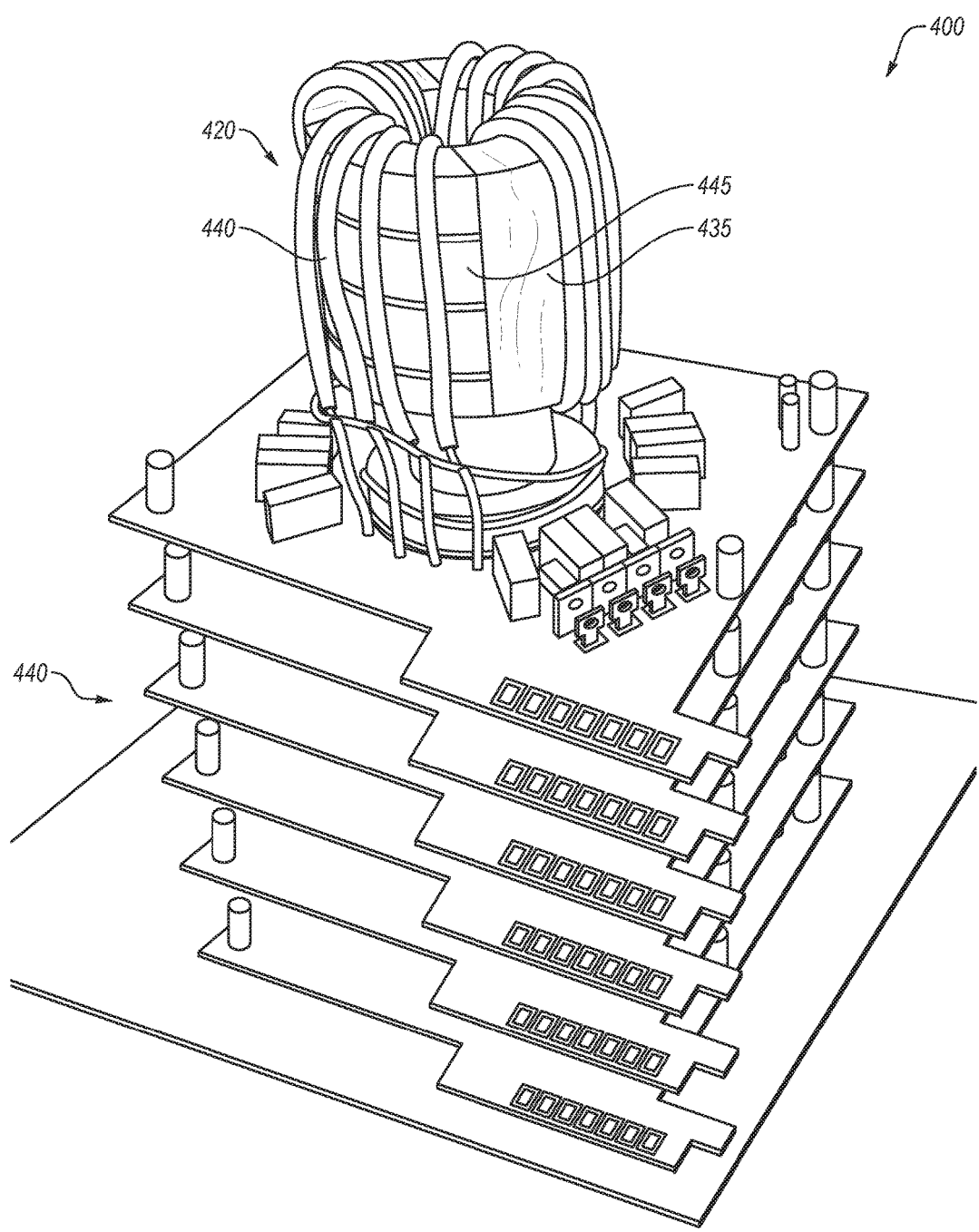
FIG. 4 is a photograph of a stacked inductive adder according to some embodiments.

FIG. 4 is a photograph of a stacked inductive adder 400 according to some embodiments. In this example, the stacked inductive adder 400 an inductive adder 440 that includes six driver and switch circuits, and a secondary transformer 420. In this example, the various components of each driver and switch are placed on a single circuit board along with a single transformer. The driver and switch are coupled with the transformer via a plurality of windings distributed around the transformer. The inductive adder 400, for example, may be a small volume inductive adder.

The primary winding around each core of each inductive adder 400 may include a conductive sheet that comprises the primary winding of the transformer.

The inductive adder 440 may be coupled with a second transformer 420. For example, the output of an inductive adder 440 (e.g., which may comprise inductive adder 100, 200, 300, etc.) may be coupled with a secondary transformer 420. The secondary transformer 420 may provide an output that has a higher output voltage than the voltage provided by the inductive adder 440. In this example, the secondary transformer 420 includes a primary winding 435 wound around four transformer cores 445 and a secondary winding 440 wound around the four transformer cores 445. While four transformer cores are shown, any number may be used. The four transformer cores 445, for example, may comprise air, iron, ferrite, soft ferrite, MnZn, NiZn, hard ferrite, powder, nickel-iron alloys, amorphous metal, glassy metal, or some combination thereof. The primary winding 440, for example, may comprise one or more conductive sheets wrapped around the transformer cores.

In some embodiments, a primary winding and/or a secondary winding may include single conductive sheet that is wrapped around at least a portion of the transformer core. A conductive sheet may wrap around the outside, top, and inside surfaces of a transformer core. Conductive traces and/or planes on and/or within the circuit board may complete the primary turn, and connect the primary turn to other circuit elements. In some embodiments, the conductive sheet may comprise a metal sheet. In some embodiments, the conductive sheet may comprise sections of pipe, tube, and/or other thin walled metal objects that have a certain geometry.

In some embodiments, a conductive sheet may terminate on one or more pads on the circuit board. In some embodiments, a conductive sheet may terminate with two or more wires.

In some embodiments, a primary winding may include a conductive paint that has been painted on one or more outside surfaces of the transformer core. In some embodiments, the conductive sheet may include a metallic layer that has been deposited on the transformer core using a deposition technique such as thermal spray coating, vapor deposition, chemical vapor deposition, ion beam deposition, plasma and thermal spray deposition, etc. In some embodiments, the conductive sheet may comprise a conductive tape material that is wrapped around the transformer core. In some embodiments, the conductive sheet may comprise a conductor that has been electroplated on the transformer core. In some embodiments, a plurality of wires in parallel can be used in place of the conductive sheet.

In some embodiments, an insulator may be disposed or deposited between transformer core and the conductive sheet. The insulator, for example, may include a polymer, a polyimide, epoxy, etc.

Figure 5:
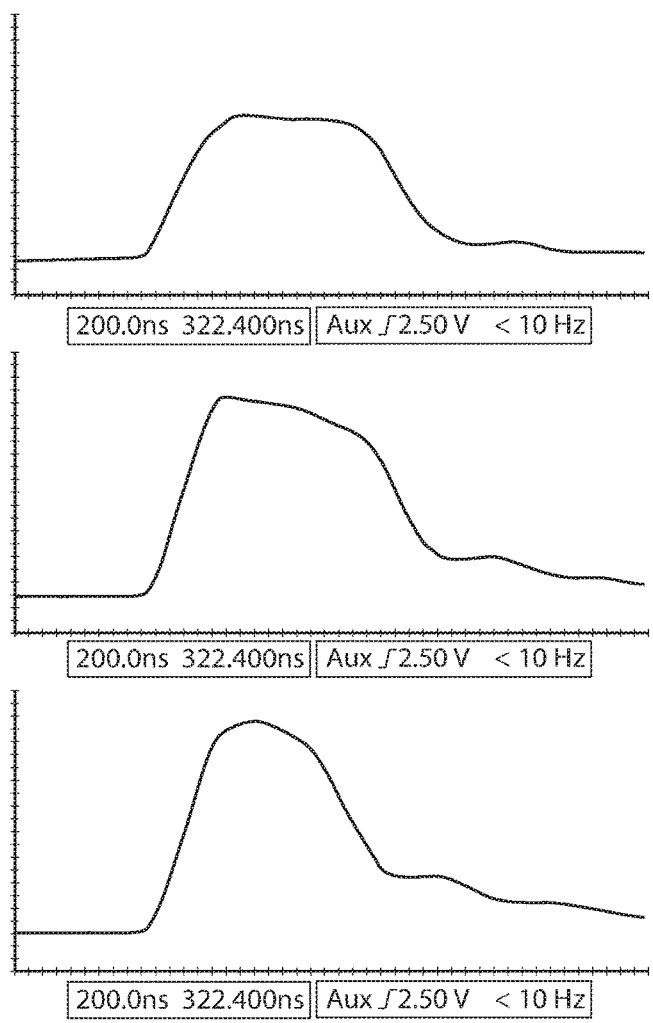
FIG. 5 shows three graphs showing different output voltages from an example stacked inductive adder.

FIG. 5 shows three graphs showing different output voltages from an example stacked inductive adder such as, for example, stacked inductive adder 400. These examples show an inductive adder producing peak output voltages of 66 kV, 74 kV, and 80 kV. In this example, the output voltage has a suitable pulse width. While this example only shows a suitable rise time of about 20 ns and pulse widths of 50-70 ns for the 66 kV example, a suitable pulse width can also be produced for the 75 kV and the 80 kV examples using the inductive adders described in accordance with embodiments of the invention. In addition, these examples show rise times of 18.05 ns, 16.82 ns, and 18.25 ns respectively.

In this example, the inductive adder 400 may be reach an output voltage of 80 kV into resistive loads, for example, from 3 to 6 kΩ In this example, rise-times from 17 to 19 ns were produced with output voltage from 66 kV to 80 kV.

Some embodiments include an inductive adder with a small volume. For example, FIG. 3 and FIG. 4 each show an inductive adder (inductive adder 300 and inductive adder 400) that have small volumes. A small volume inductive adder may include an inductive adder having a volume less than about 5 $m^3$, 2.5 $m^3$, 2.0 $m^3$, 1.75 $m^3$, 1.5 $m^3$, 1.25 $m^3$, 1.0 $m^3$, 0.75 $m^3$, 0.5 $m^3$, 0.25 $m^3$, etc. and/or a mass less than about 1200 kg, 1000 kg, 750 kg, 500 kg, 250 kg, 150 kg, 125 kg, 100 kg, 50 kg, etc.

In some embodiments, an inductive adder (e.g., the inductive adder shown in FIG. 3 and/or FIG. 4) may produce a pulse width of about 10 ns, 20 ns, 30 ns, 40 ns 50 ns, etc. In some embodiments, an inductive adder may produce a pulse width greater than about 20 ns. In some embodiments, an inductive adder may have a variable pulse width. For example, the inductive adder may produce a first pulse having a first pulse width and a second pulse with a second pulse width where the first pulse width and the second pulse width are different and/or the first pulse width and the second pulse width may have variable pulse widths.

In some embodiments, an inductive adder (e.g., the inductive adder shown in FIG. 3 and/or FIG. 4) may drive 1000 ohms, 200 ohms, 100 ohms, 20 ohms, 2 ohms, etc. loads to voltages greater than about 5 kV, 8 kV, 20 kV, 50 kV, 100 kV, 250 kV, 500 kV, 1 MV or more with rise times of less than about 200 ns, 100 ns, 33 ns, 20 ns, 3 ns, etc. In some embodiments, an inductive adder may produce variable pulse widths of up to 100 ns. In some embodiments, an inductive adder may operate at frequencies greater than about 2 kHz, 10 kHz, 25 kHz, 300 kHz, 6 MHz, etc. In some embodiments, an inductive adder may provide an output pulse with pulse widths of about 1 ns, 22 ns, 400 ns, 1000 ns, etc.

In some embodiments, an inductive adder may produce a flattop voltage with a timing jitter less than about 88 ns, 50 ns, 25 ns, 10 ns, 5 ns, 3 ns, 1 ns, 0.1 ns, etc.

In some embodiments, an inductive adder may produce a flattop voltage greater than about 8 kV, 15 kV, 20 kV, 25 kV, 35 kV, 50 kV, 75 kV, 100 kV, 125 kV, 150 kV, 175 kV, 200 kV, etc.

Figure 6:
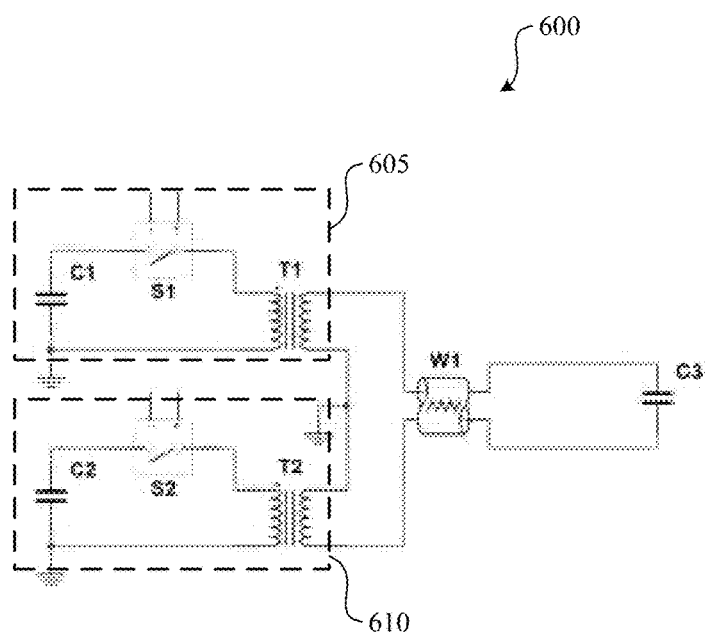
FIG. 6 illustrates a combined inductive adder according to some embodiments.

FIG. 6 illustrates a combined inductive adder 600 according to some embodiments. In this example, a first inductive adder 605 and a second inductive adder 610 are combined with opposite polarities to produce the combined inductive adder 600 that can produce an output voltage that is the sum of the output voltages of the first inductive adder 605 and the second inductive adder 610. The first inductive adder 605 and/or the second inductive adder 610 may include any number of switches and/or transformers. The capacitance and/or inductance of the first inductive adder 605 and/or the second inductive adder 610, for example, may include any value discussed in here. In some embodiments, multiple inductive adders may be arranged in parallel to drive lower impedance loads, and/or to produce higher output voltages, and/or drive faster output rise times.

In some embodiments, the first inductive adder 605 and/or the second inductive adder 610 may or may not be coupled with a transmission line.

Figure 7:
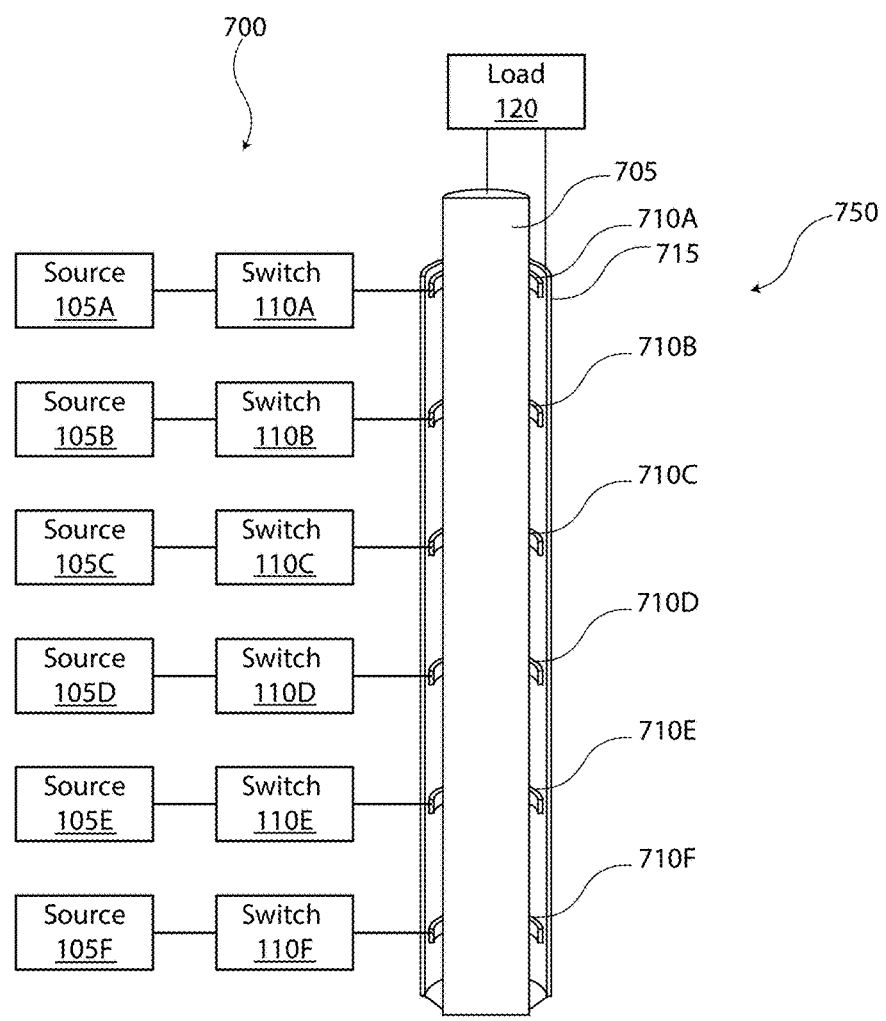
FIG. 7 is a block diagram of an inductive adder with a coaxial transformer according to some embodiments.

In some embodiments, the first inductive adder 605 and the second inductive adder 610 may be grounded to produce opposite polarities. In some embodiments, the combined inductive adder 600 may include a central ground reference. FIG. 7 is a block diagram of an inductive adder 700 with a coaxial transformer 750 according to some embodiments. The figure shows a cross section of the coaxial transformer 750. The coaxial transformer 750 includes a plurality of ferrite cores 710 that are coupled with the source 105 and the switch 110 via one more primary winding wound around a ferrite core. The one or more primary winding may include a conductive sheet wrapped at least partially around the ferrite core. The coaxial transformer 750 also includes a secondary winding that comprises a conductive inner rod 705 and an outer cylinder 715. The plurality of ferrite cores 710 may comprise a cylinder surrounding the inner rod 705. The outer cylinder 715 wraps around both the inner rod 705 and the plurality of ferrite cores 710.

The spacing between the inner rod 705 and the ferrite cores 710 may be less than about 0.5 cm, 1 cm, 2 cm, etc. In some embodiments, the space between the inner rod 705 and the ferrite cores 710 may include a nonconductive material such as, for example, oil, epoxy, dielectric potting compounds, air, $SF_6$, or any dielectric material. In some embodiments, the dimensions and/or spacing of the primary, secondary, and/or cores may be set such that the entire structure has a specific characteristic impedance, where the characteristic impedance selected may be (but not always) matched to the impedance of the output cable and/or load.

The spacing between the outer cylinder 715 and the ferrite cores 710 may be less than about 0.5 cm, 1 cm, 2 cm, etc. In some embodiments, the space between the outer cylinder 715 and the ferrite cores 710 may include a nonconductive material such as, for example, oil, epoxy, dielectric potting compounds, air, $SF_6$, or any dielectric material.

The outer cylinder 715, for example, may comprise a plurality of shorter outer rings coupled together to form the long outer cylinder. For example, each shorter outer ring may be coupled with a circuit board and press fit together to form the outer cylinder 715. In some embodiments, the outer rings may comprise brass or any other metal.

In some embodiments, the inner rod 705 may comprise any conductive material such as, for example, aluminum, copper, brass, nickel, steel, iron, etc. In some embodiments, the outer cylinder 715 may comprise any conductive material such as, for example, aluminum, copper, nickel, steel, brass, iron, etc.

Figure 8:
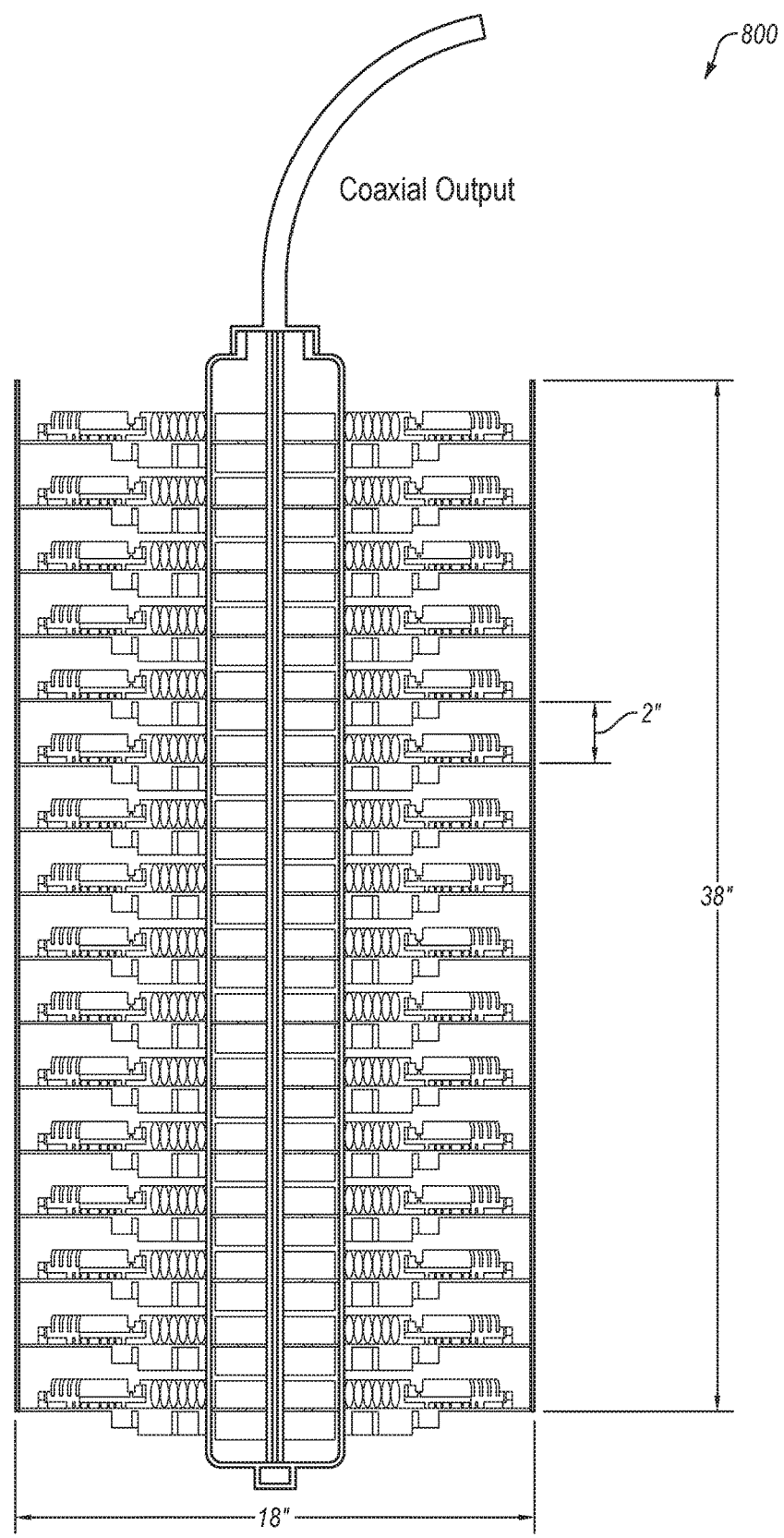
FIG. 8 is an image of a stacked inductive adder according to some embodiments.

One of the many challenges faced by pulsing systems is size constraints. The technology used by typical pulsing systems limit the ability to acceptably scale the system to small volumes. FIG. 8 is a side view of a single inductive adder with a coaxial transformer. FIG. 10 includes two photographs of an inductive adder according to some embodiments.

Figure 9:
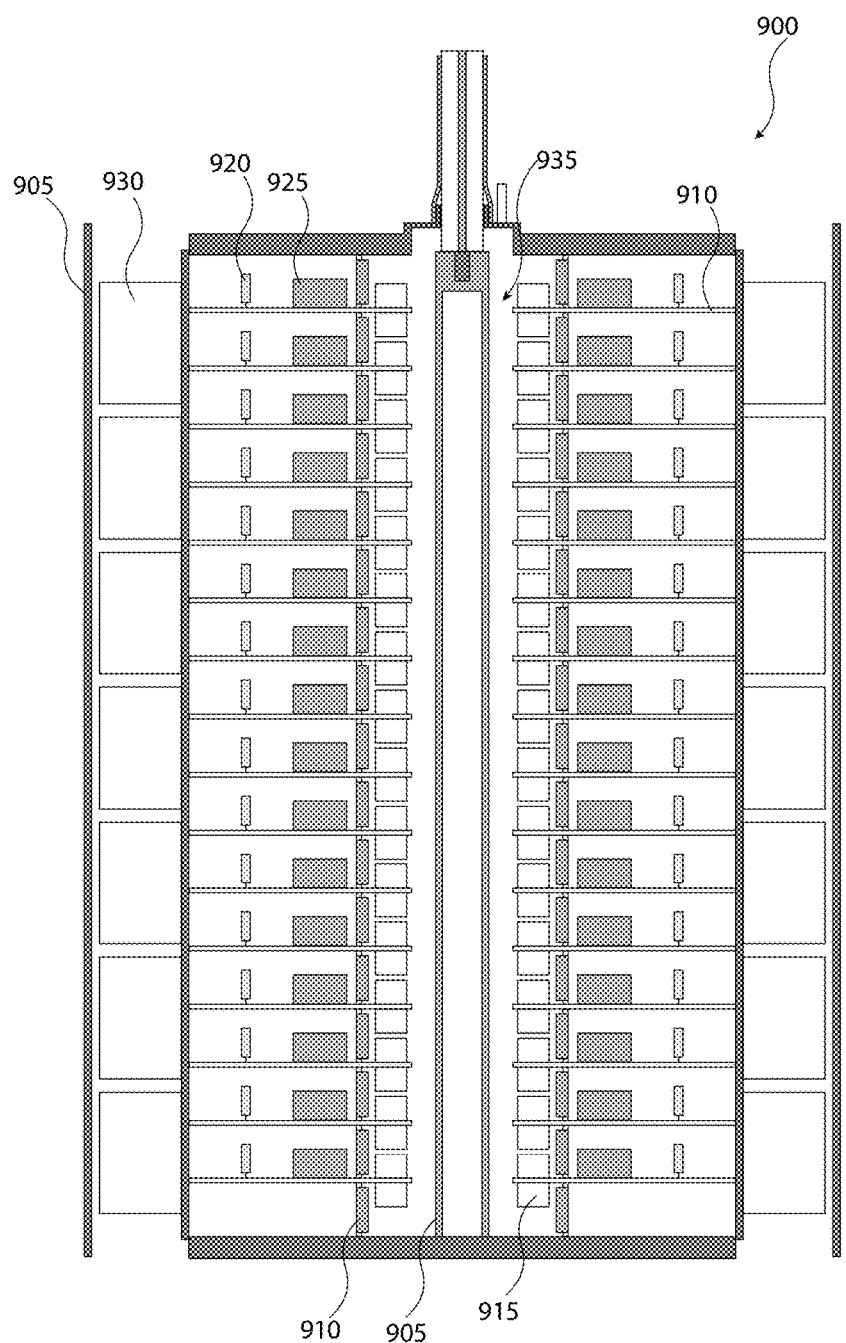
FIG. 9 illustrates a side cutaway view of an inductive adder according to some embodiments.

FIG. 9 illustrates a side cutaway view of an inductive adder 900 according to some embodiments. The inductive adder 900 may include a coaxial transformer. The inductive adder 900 may, for example, include one or more outer chassis walls 905. The inductive adder 900 may, for example, include a plurality of stacked circuit boards 910. Each stacked circuit board 910 may, for example, include an aperture 935 through a central portion of the circuit board 910. Each stacked circuit board 910 may, for example, include a switch 920 (e.g., switch 110), a fast capacitor 925, and/or energy storage capacitor 930.

The coaxial transformer of the inductive adder 900 may comprise a plurality of toroid-shaped ferrite cores 915. Each ferrite core 915 may have one or more primary windings wound around the ferrite core 915. The primary windings may include a conductive sheet. The coaxial transformer may also include a secondary winding comprising a conductive inner rod 905 that extends through the apertures 935 in the circuit boards 910 and the outer cylinder 910. The outer cylinder 910, for example, may comprise a plurality of brass rings that can be press fit together.

FIG. 10 includes two photographs of an inductive adder with a coaxial transformer.

Figure 11:
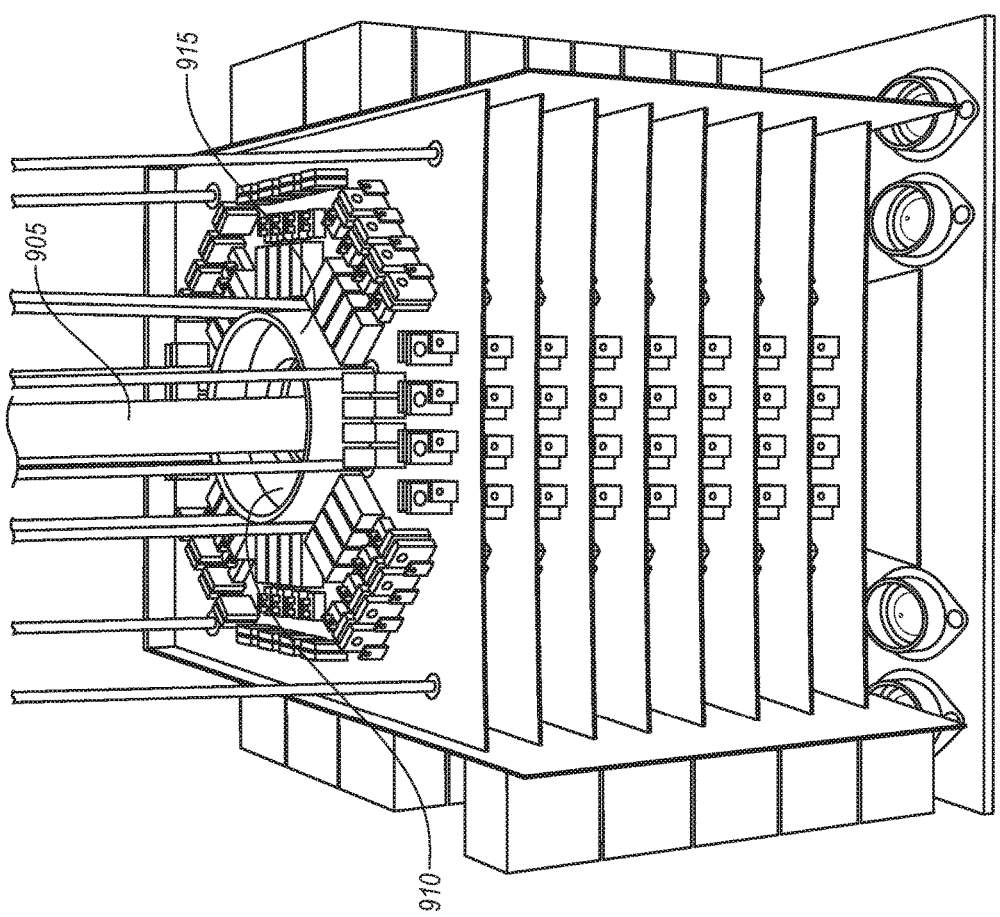
FIG. 11 is a photograph of an inductive adder with a coaxial transformer.

FIG. 11 is another photograph of an inductive adder.

Figure 12:
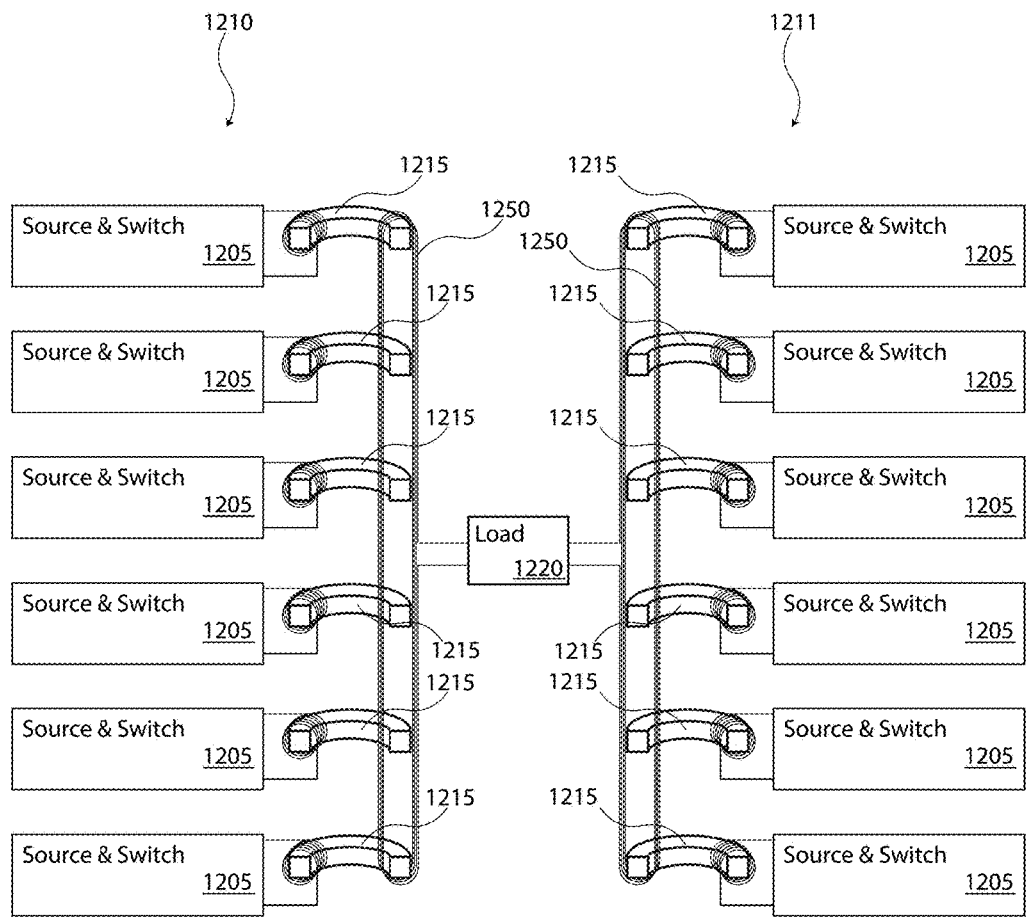
FIG. 12 is a block diagram of two inductive adders in parallel.

FIG. 12 is a block diagram of two inductive adders 1210, 1211 coupled together in parallel according to some embodiments. The two inductive transformers may provide a voltage to the load 1220 that is the same as a single inductive transformer but provide about twice the current where each inductive adder provides a portion of the current. In this example, each inductive adder includes a plurality of source and switch circuits 1205 and a plurality of transformer cores 1215. Each respective transformer core 1215 may be coupled with a switch circuit 1205 via a primary winding. Each inductive adder includes a secondary winding 1250 wound about a plurality of the transformer cores 1215.

The transformers shown in FIG. 10 can be replaced with a coaxial transformer such as, for example, the coaxial transformer shown in FIG. 7.

Figure 13A:
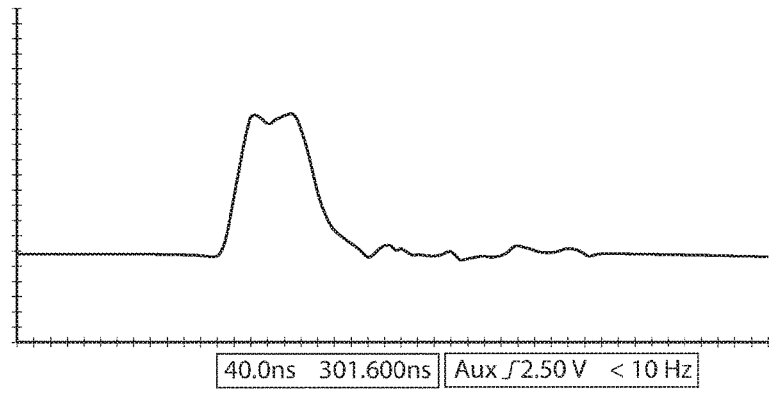
FIG. 13A illustrates a waveform produced from an inductive adder according to some embodiments.

FIG. 13A illustrates a waveform produced from an inductive adder according to some embodiments. This waveform shows an inductive adder that produces a 35 kV waveform with a 40 ns pulse width with a rise time of about 11-13 ns.

Figure 13B:
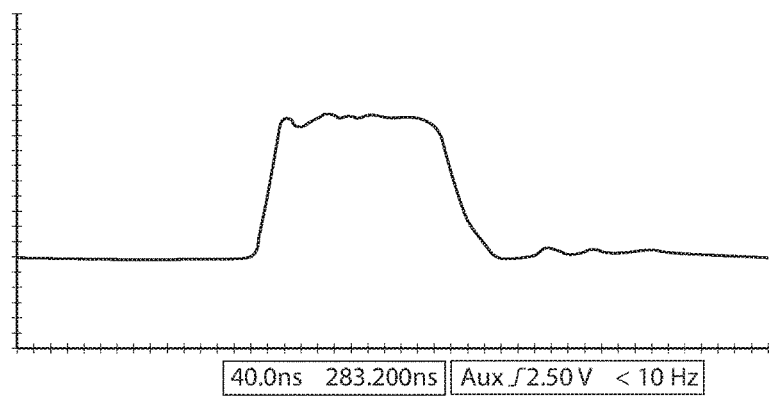
FIG. 13B illustrates a waveform produced from an inductive adder according to some embodiments.

FIG. 13B illustrates a waveform produced from an inductive adder according to some embodiments. This waveform shows an inductive adder that produces a 35 kV waveform with a 100 ns pulse width with a rise time of about 11-13 ns.

Some embodiments of the invention may provide a high voltage inductive adder that produces high voltage pulses (e.g., greater than about 35 kV), with a suitable pulse width (e.g., greater than about 10 ns), and a sharp rise time (e.g., less than about 20 ns). In some embodiments, the high voltage inductive adder has a small volume (e.g., less than about 2.5 m$^3$). The small volume (possibly in conjunction with the other pulse characteristics) of some embodiments is much more than mere window dressing. Instead, the small volume may allow a high voltage inductive adder, for example, to be used in aerial drones, small vehicles, airplanes, boats, desktop lab equipment, consumer devices, medical devices, etc.

In some embodiments, the output pulses from the inductive adder may have a pulse width and/or a pulse repetition frequency that is related to the time the one or more switches driving the primary winding are open. For example, the opening and/or closing of the one or more switches may dictate the pulse width and/or the pulse repetition frequency of the inductive adder. In some embodiments, the output pulse may have a pulse width that is proportional (e.g., directly proportional) to the time the time the one or more switches are closed. In some embodiments, the output pulse may have a pulse repetition frequency that is proportional to the frequency of the switches are switched on and/or off. In some embodiments, the output pulse may have a variable pulse width and/or variable pulse repetition frequency by varying the frequency and/or duration of opening and closing the switches.

The term "substantially" means within 5% or 10% of the value referred to or within manufacturing tolerances.

Various embodiments are disclosed. The various embodiments may be partially or completely combined to produce other embodiments.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A high voltage inductive adder comprising:
    a first source;
    a first switch electrically coupled with the first source;
    a first transformer core having a torus shape with a first central aperture, the first transformer core electrically coupled with the first switch via a first primary winding;
    a second source;
    a second switch electrically coupled with the second source;
    a second transformer core having a torus shape with a second central aperture, the second transformer core electrically coupled with the second switch via a second primary winding;
    a secondary winding including:
        an inner rod disposed within the first central aperture and the second central aperture; and
        outer cylinder surrounding the first transformer core and the second transformer core, wherein the outer cylinder and the inner rod are electrically coupled together;
    an output coupled with the outer cylinder and the inner rod configured to couple with an external load.

2. The high voltage inductive adder according to claim 1, wherein the outer cylinder comprises a first cylinder surrounding the first transformer core and a second cylinder surrounding the second transformer core, the first cylinder and the second cylinder being electrically connected.

3. The high voltage inductive adder according to claim 1, wherein the high frequency inductive adder produces an output signal at the output having a voltage greater than about 20 kV.

4. The high voltage inductive adder according to claim 1, wherein the output signal has a rise time of less than about 40 ns.

5. The high voltage inductive adder according to claim 1, wherein the output signal has a variable or varying pulse repetition frequency and/or a variable or varying voltage and/or variable or varying pulse width.

6. The high voltage inductive adder according to claim 1, wherein the stray capacitance of the high voltage inductive adder as measured from the secondary is less than 500 pF.

7. The high voltage inductive adder according to claim 1, wherein the stray inductance of the circuit comprising the first source; the first switch; the first transformer core; and the first plurality of primary windings is less than about 30 nH.

8. The high voltage inductive adder according to claim 1, wherein the output signal has a pulse frequency of at least 10 kHz.

* * * * *